(12) United States Patent
Tateishi

(10) Patent No.: US 10,431,496 B2
(45) Date of Patent: Oct. 1, 2019

(54) DEVICE CHIP PACKAGE MANUFACTURING METHOD

(71) Applicant: DISCO CORPORATION, Tokyo (JP)

(72) Inventor: Toshiyuki Tateishi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/801,520

(22) Filed: Nov. 2, 2017

(65) Prior Publication Data
US 2018/0144981 A1 May 24, 2018

(30) Foreign Application Priority Data
Nov. 18, 2016 (JP) .................................. 2016-225065

(51) Int. Cl.
| | |
|---|---|
| *H01L 21/78* | (2006.01) |
| *H01L 21/304* | (2006.01) |
| *H01L 21/56* | (2006.01) |
| *H01L 21/687* | (2006.01) |
| *H01L 23/31* | (2006.01) |
| *H01L 21/683* | (2006.01) |

(52) U.S. Cl.
CPC ............ *H01L 21/78* (2013.01); *H01L 21/304* (2013.01); *H01L 21/561* (2013.01); *H01L 21/68721* (2013.01); *H01L 23/3114* (2013.01); *H01L 21/6836* (2013.01); *H01L 21/6838* (2013.01); *H01L 2221/6834* (2013.01); *H01L 2221/68327* (2013.01)

(58) Field of Classification Search
CPC ..... H01L 21/304; H01L 21/681; H01L 21/78; H01L 21/561
See application file for complete search history.

(56) References Cited

U.S. PATENT DOCUMENTS

| | | | | |
|---|---|---|---|---|
| 2005/0045090 A1* | 3/2005 | Ikegami | ............... | B23K 26/073 117/8 |
| 2017/0045448 A1* | 2/2017 | Lin | ......................... | G01N 21/59 |
| 2017/0069537 A1* | 3/2017 | Sugiya | ..................... | H01L 21/78 |

FOREIGN PATENT DOCUMENTS

JP        2001-127206        5/2001

* cited by examiner

*Primary Examiner* — Zandra V Smith
*Assistant Examiner* — John M Parker
(74) *Attorney, Agent, or Firm* — Greer Burns & Crain, Ltd.

(57) ABSTRACT

Disclosed herein is a device chip package manufacturing method including a cutting step of forming cut grooves having a depth reaching a finished thickness of device chips by cutting a device wafer from a top surface of the device wafer along streets by a cutting blade, a cut groove inclination state detecting step of detecting an inclination state of the cut grooves, a sealing resin layer forming step of forming a sealing resin layer coating the top surface and the cut grooves of the device wafer by supplying a sealing resin to the top surface of the device wafer, and a laser processing step of dividing the device wafer into individual chips and forming device chip packages by applying a laser beam having a wavelength absorbable by the sealing resin layer along the cut grooves of the device wafer held by a chuck table.

12 Claims, 10 Drawing Sheets

DEVICE CHIP PACKAGE MANUFACTURING METHOD

BACKGROUND OF THE INVENTION

Field of the Invention

The present invention relates to a method of manufacturing a device chip package in which a top surface and a side surface of a device chip having the top surface, an undersurface, and the side surface, and having a device formed on the top surface are sealed with a resin.

Description of the Related Art

In a semiconductor device manufacturing process, a plurality of regions are demarcated by planned dividing lines referred to as streets formed in a lattice manner on the top surface of a semiconductor wafer in substantially the shape of a disk, and devices such as integrated circuits (ICs), large scale integrations (LSIs), or the like are formed in the demarcated regions. Then, the semiconductor wafer is cut along the streets by a cutting apparatus. The semiconductor wafer is thereby divided into individual device chips.

The streets of semiconductor wafers have recently been narrowed to increase the number of device chips to be obtained. A method is known which forms cut grooves by half cutting a semiconductor wafer having thus narrowed streets, next seals the top surface and cut grooves of the semiconductor wafer with a resin by supplying a sealing resin to the top surface of the semiconductor wafer, and then divides the semiconductor wafer into individual device chip packages by irradiating the cut grooves with a laser beam.

SUMMARY OF THE INVENTION

However, when the semiconductor wafer is half cut by a cutting blade having a very small edge thickness, the cutting edge of the cutting blade is bent and the half cut grooves are inclined at the time of the half cutting. When the inclined cut grooves are irradiated with a laser beam, the side surfaces of the half cut grooves are irradiated with the laser beam, and therefore the side surfaces of the divided device chips have a part not sealed with the resin.

It is accordingly an object of the present invention to provide a device chip package manufacturing method that can completely seal the top surfaces and side surfaces of device chips with a resin.

In accordance with an aspect of the present invention, there is provided a device chip package manufacturing method including a cutting step of forming cut grooves having a depth reaching a finished thickness of device chips by cutting a device wafer from a top surface of the device wafer along a plurality of intersecting streets formed on the top surface by a cutting blade, the device wafer having devices formed in respective regions demarcated by the streets, a cut groove inclination state detecting step of detecting an inclination state of the cut grooves while the cutting step is performed or after the cutting step is performed, a sealing resin layer forming step of forming a sealing resin layer coating the top surface and the cut grooves of the device wafer by supplying a sealing resin to the top surface of the device wafer after the cutting step and the cut groove inclination state detecting step are performed, a grinding step of thinning the device wafer to the finished thickness of the device chips by grinding an undersurface of the device wafer after the sealing resin layer forming step is performed, and a laser processing step of dividing the device wafer into individual chips and forming device chip packages by holding the device wafer by a holding surface of a chuck table and applying a laser beam having a wavelength absorbable by the sealing resin layer along the cut grooves of the device wafer held by the chuck table after the grinding step is performed. The laser processing step applies the laser beam in parallel with the cut grooves while the holding surface of the chuck table and the laser beam are inclined relative to each other on the basis of the inclination state of the cut grooves, the inclination state being detected in the cut groove inclination state detecting step.

Preferably, the laser processing step applies the laser beam in parallel with the cut grooves by inclining the chuck table, and thereby divides the device wafer into the individual chips.

According to the device chip package manufacturing method in accordance with the present invention, the laser beam is applied in parallel with the cut grooves while the holding surface of the chuck table and the laser beam are inclined relative to each other on the basis of the inclination state of the cut grooves, the inclination state being detected in the cut groove inclination state detecting step. It is thus possible to prevent a fear that the side surfaces of the manufactured device chip packages have a part not sealed with the resin.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
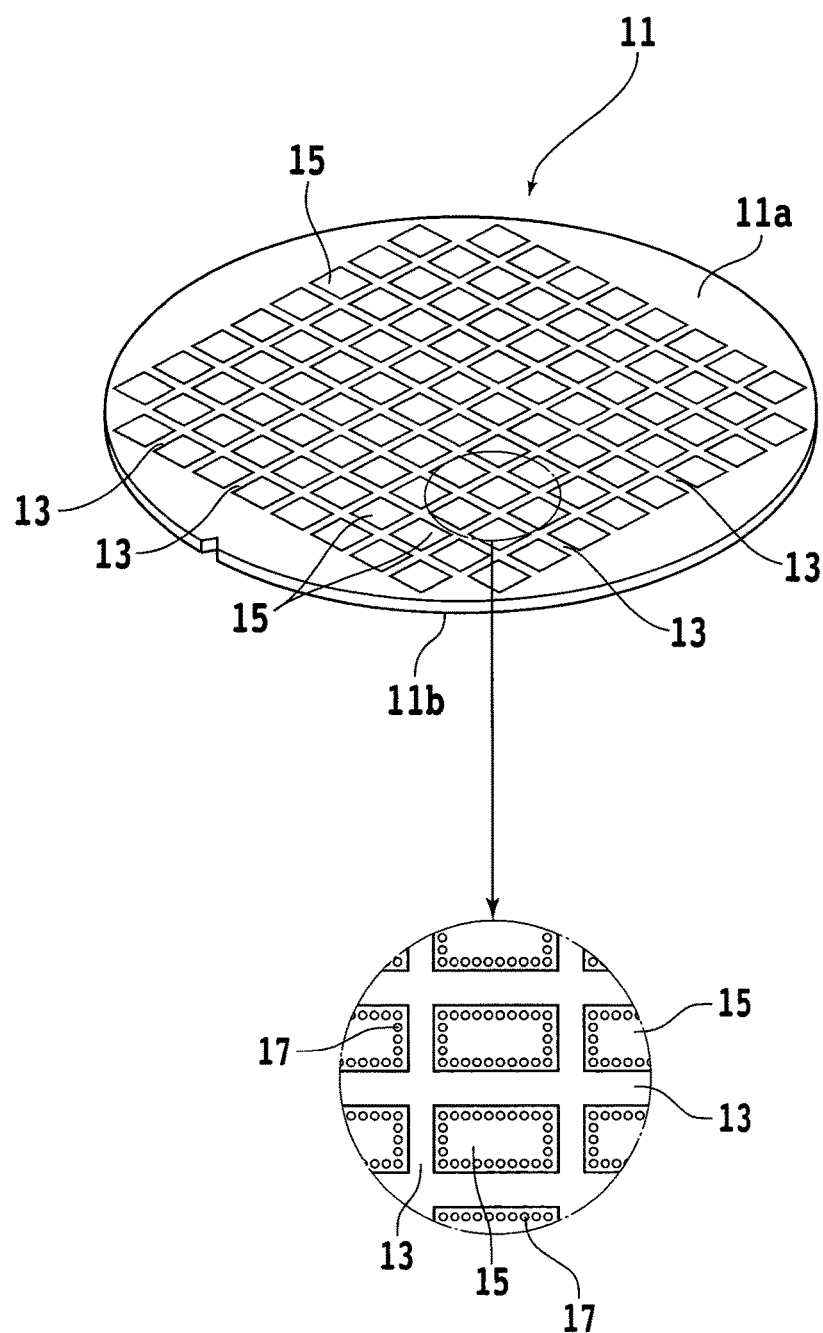
FIG. 1 is a perspective view of a device wafer (semiconductor wafer)
Figure 2:
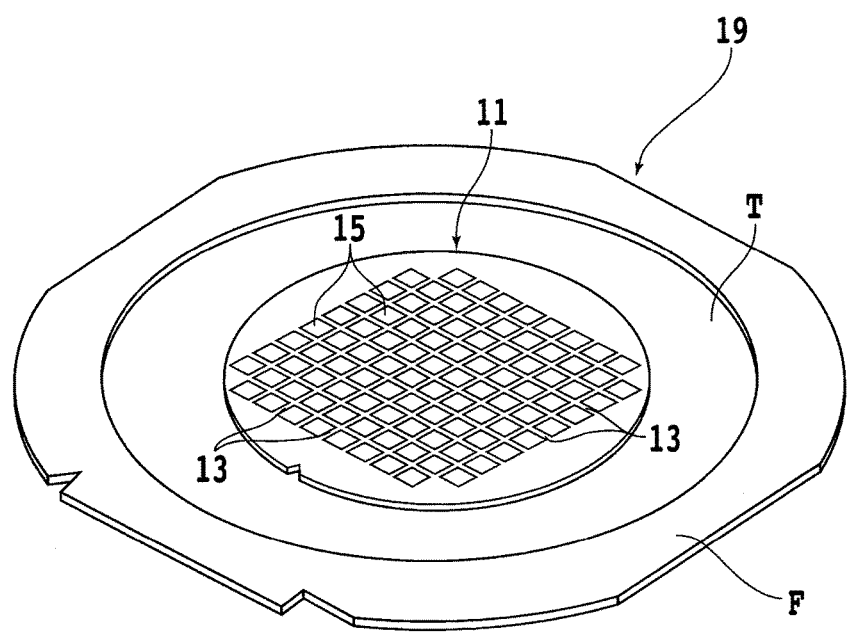
FIG. 2 is a perspective view of a wafer unit in which the device wafer is supported by an annular frame via a dicing tape.

An embodiment of the present invention will hereinafter be described in detail with reference to the drawings. FIG. 1 is a perspective view of a device wafer (semiconductor wafer) 11 as a processing object of a manufacturing method according to the present invention. The device wafer 11 has a top surface 11a and an undersurface 11b. A plurality of streets (planned dividing lines) 13 are formed on the top surface 11a in an orthogonal manner. Devices 15 are formed in respective regions demarcated by the intersecting streets 13. A plurality of bumps 17 in a projecting shape are formed along four sides of each device 15.

When the manufacturing method according to the present invention is performed, a wafer unit 19 formed by sticking the undersurface of the device wafer 11 to a dicing tape T and fitting the periphery of the dicing tape T to an annular frame F is introduced into a cutting apparatus. In the method of manufacturing device chip packages according to the present embodiment, a cutting step is performed first which forms cut grooves having a depth reaching a finished thickness of device chips by cutting the device wafer along the streets by a cutting blade, the device wafer having the devices formed in the respective regions demarcated by the plurality of intersecting streets.

Figure 3:
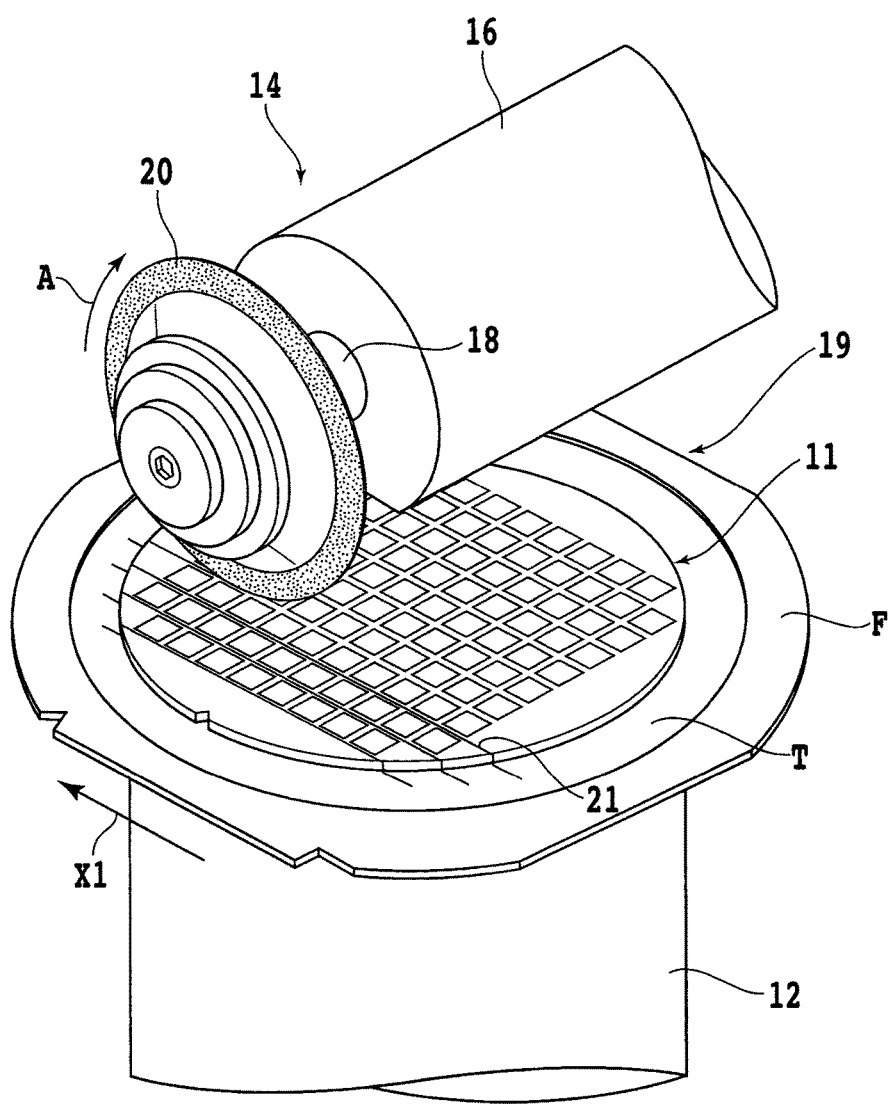
FIG. 3 is a perspective view depicting a cutting step.

In this cutting step, as depicted in FIG. 3, the device wafer 11 of the wafer unit 19 is suction-held by a chuck table 12 of the cutting apparatus via the dicing tape T, and the annular frame F is clamped and fixed by a clamp not depicted in the figure. A cutting unit 14 of the cutting apparatus includes a spindle 18 rotatably housed in a spindle housing 16, and a cutting blade 20 mounted on an end portion of the spindle 18. The cutting blade 20 has a very thin cutting edge of 20 μm or less, for example, and is thus suitable for cutting a device wafer having narrowed streets.

In the cutting step, the cutting blade 20 rotating at a high speed in the direction of an arrow A cuts in the streets 13 of the device wafer 11 from the top surface side of the device wafer 11 to a depth reaching the finished thickness of device chips to be manufactured, and the chuck table 12 is processing-fed in the direction of an arrow X1. Cut grooves 21 having a depth reaching the finished thickness of the device chips are thereby formed in the device wafer 11. Similar cut grooves 21 are formed one after another along streets 13 extending in a first direction while indexing feed is performed by the pitch of the streets 13 in a direction orthogonal to the processing feed direction X1. Next, the chuck table 12 is rotated by 90 degrees. Then, similar cut grooves 21 are formed along all of streets 13 extending in a second direction orthogonal to the first direction.

Figure 4:
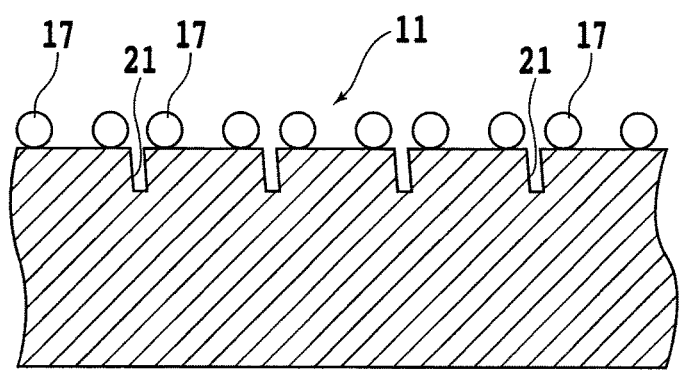
FIG. 4 is a sectional view of the device wafer after the cutting step is performed.

FIG. 4 is an enlarged sectional view of the device wafer 11 after the cutting step is performed. The cutting blade 20 performing the cutting step has a blade edge (cutting edge) with a very small edge thickness. Thus, at a time of half cutting of the device wafer 11 using the cutting blade 20, the cutting edge of the cutting blade 20 is bent, and the half-cut grooves 21 are inclined with respect to the top surface 11a of the device wafer 11. All of the cut grooves 21 tend to be inclined in an identical direction.

Figure 5:
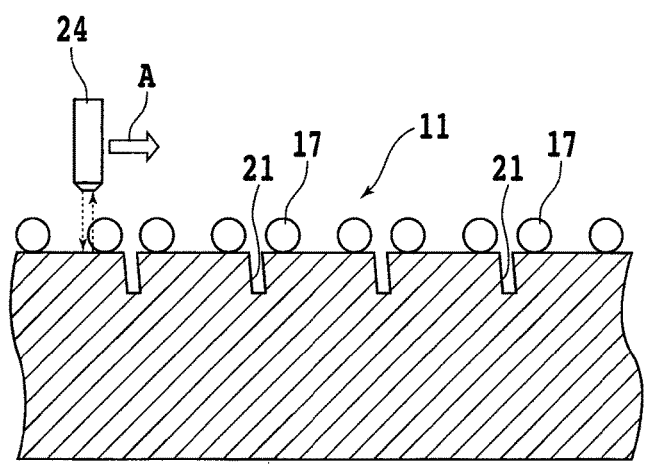
FIG. 5 is a sectional view depicting a cut groove inclination state detecting step.

Accordingly, in the method of manufacturing device chip packages according to the present embodiment, as depicted in FIG. 5, the top surface of the device wafer 11 is irradiated with a laser beam from a laser displacement gage 24, the inclination state of the cut grooves 21 is detected by moving the laser displacement gage 24 in the direction of an arrow A, and the inclination state is stored in a memory of the laser displacement gage, for example. The inclination of the cut grooves 21 may also be detected by using the depth of focus of an imaging unit including a microscope and an imaging element in place of the laser displacement gage.

Figure 6:
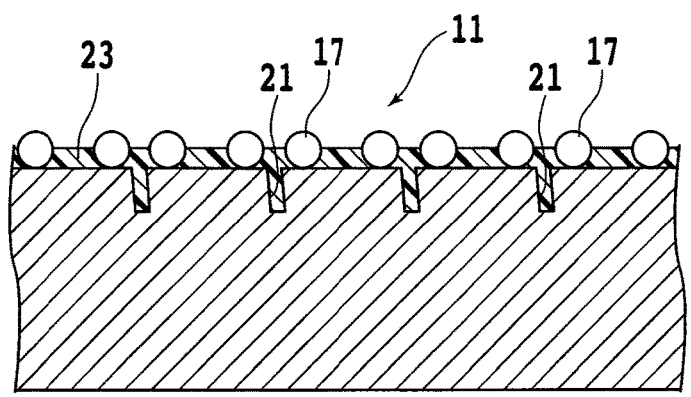
FIG. 6 is a sectional view after a sealing resin layer forming step is performed.

After the cutting step and the cut groove inclination state detecting step described above are performed, as depicted in FIG. 6, a sealing resin layer forming step is performed which coats the top surface 11a and the cut grooves 21 of the device wafer 11 with a sealing resin layer 23 by supplying a sealing resin to the top surface of the device wafer 11. The sealing resin layer 23 is preferably formed to a thickness such that bumps 17 project slightly. The sealing resin layer 23 is formed by for example an epoxy resin or the like.

After the sealing resin layer forming step is performed, a grinding step is performed which achieves thinning to the finished thickness of the device chips by grinding the undersurface 11b of the device wafer 11. Before the grinding step is performed, the device wafer 11 is peeled from the dicing tape T of the wafer unit 19, and then a top surface protective tape 25 is stuck to the top surface 11a of the device wafer to protect the devices 15. Then, as depicted in FIG. 7, the top surface protective tape 25 side is suction-held by a chuck table 28 of a grinding apparatus, and the undersurface 11b of the device wafer 11 is exposed.

Figure 7:
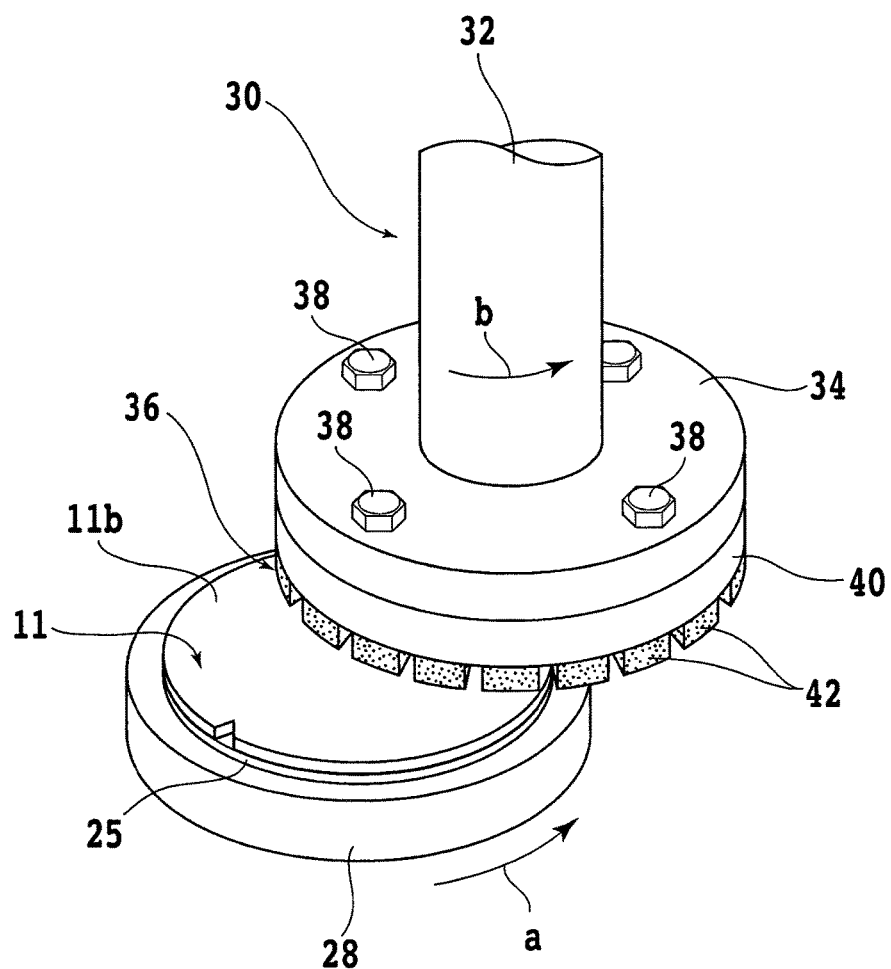
FIG. 7 is a perspective view depicting a grinding step.

In FIG. 7, a grinding unit 30 of the grinding apparatus includes a spindle 32 rotation-driven by a motor, a wheel mount 34 fixed to an end of the spindle 32, and a grinding wheel 36 detachably fitted to the wheel mount 34 by a plurality of screws 38. The grinding wheel 36 is constituted of an annular wheel base 40 and a plurality of grinding stones 42 fixed to the periphery of a lower end of the wheel base 40.

In the grinding step, while the chuck table 28 is rotated at 300 rpm, for example, in the direction of an arrow a, the grinding wheel 36 is rotated at 6000 rpm, for example, in the same direction as the chuck table 28, that is, the direction of an arrow b, and the grinding stones 42 of the grinding wheel 36 are brought into contact with the undersurface 11b of the device wafer 11 by driving a grinding unit feed mechanism not depicted.

Figure 8:
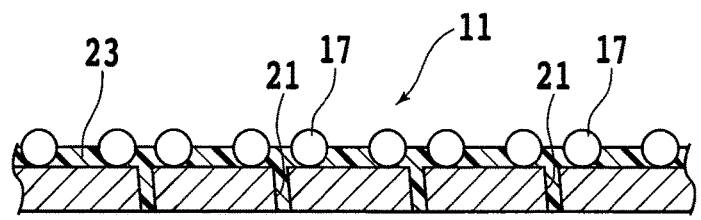
FIG. 8 is a sectional view of the device wafer after the grinding step is performed.

Then, the undersurface 11b of the device wafer 11 is ground while the grinding wheel 36 is grinding-fed downward by a predetermined amount at a predetermined grinding feed speed. The device wafer 11 is thus thinned to the finished thickness of the device chips. FIG. 8 is a sectional view of the device wafer 11 after the grinding step is performed.

Figure 9:
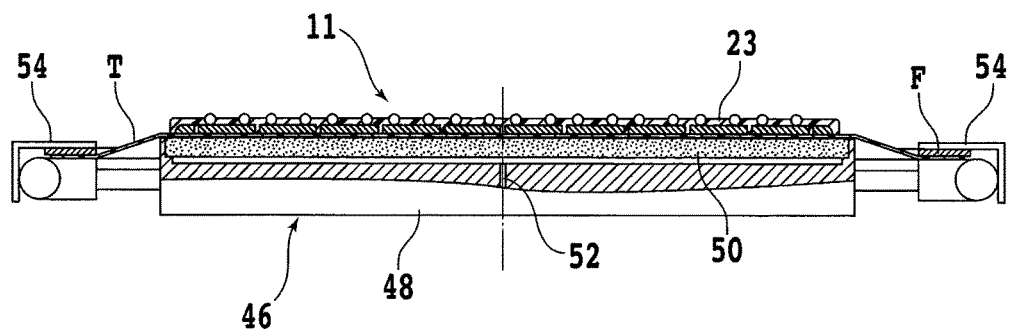
FIG. 9 is a partially sectional side view of a state in which the wafer unit is retained by a chuck table.

After the grinding step is performed, as depicted in FIG. 9, the undersurface side of the device wafer 11 is suction-held by a suction holding unit 50 of a chuck table 46 of a laser processing apparatus via the dicing tape T, and the annular frame F of the wafer unit 19 is clamped and fixed by a clamp 54. In FIG. 9, the suction holding unit 50 is selectively connected to a suction source, not depicted, via a suction passage 52 formed in a metallic frame body 48.

After the device wafer 11 is suction-held by the chuck table 46, a laser processing step is performed which applies a laser beam LB in parallel with the cut grooves 21 while a holding surface of the chuck table 46 and the laser beam LB applied from a condenser 56 are inclined relative to each other on the basis of the inclination state of the cut grooves 21 which inclination state is detected in the cut groove inclination state detecting step.

Figure 10:
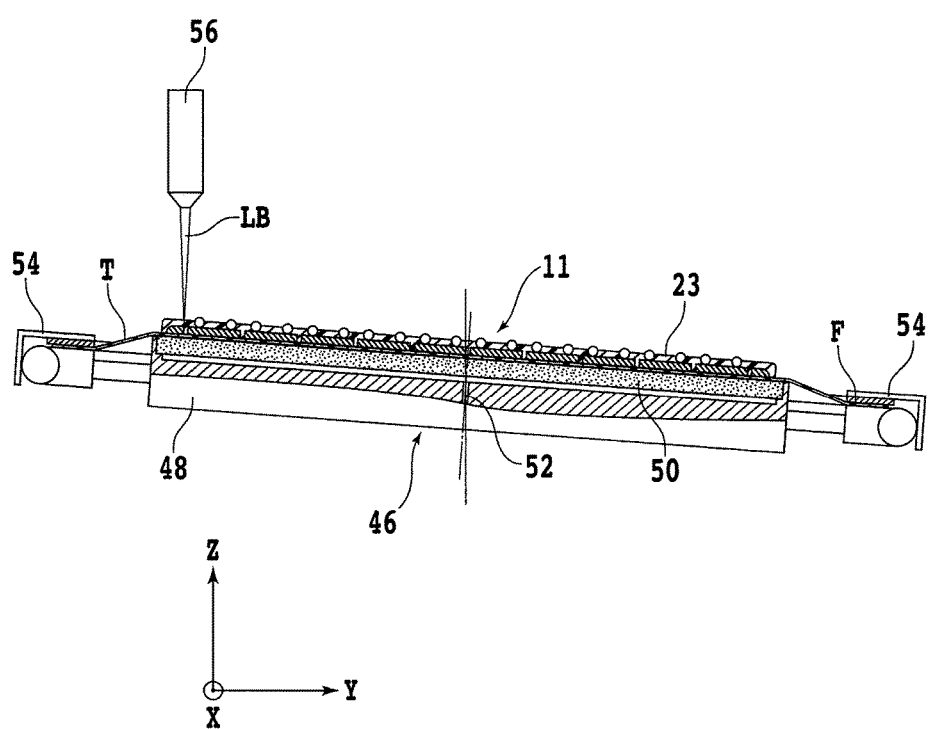
FIG. 10 is a partially sectional side view depicting a laser processing step.

In the present embodiment, as depicted in FIG. 10, the laser beam LB is inclined so as to be parallel with the cut grooves 21 on the basis of the inclination state of the cut grooves 21, by using a mechanism disclosed in Japanese Patent Laid-Open No. 2013-119123 or a mechanism disclosed in Japanese Patent Laid-Open No. 2014-237210, for example. Then, the sealing resin layer 23 in the cut grooves 21 is cut by irradiating the cut grooves 21 with the laser beam LB having a wavelength (for example 355 nm) absorbable by the sealing resin layer 23.

The device wafer 11 is completely cut off by the irradiation with the laser beam LB along the streets 13 extending in the first direction while the chuck table 46 is indexing-fed in a Y-axis direction by the pitch of the streets 13. After the cutting along all of the streets 13 extending in the first direction is completed, the chuck table 46 is rotated by 90 degrees. A similar laser processing step is then performed along all of the streets 13 extending in the second direction orthogonal to the first direction. Consequently, the device wafer 11 is divided into individual chips, and device chip packages whose top surface and side surfaces are sealed with the sealing resin layer 23 are formed.

In the foregoing embodiment, the laser processing step applies the laser beam LB in parallel with the cut grooves 21 while the holding surface of the chuck table 46 and the laser beam LB are inclined relative to each other on the basis of the inclination state of the cut grooves 21 which inclination state is detected in the cut groove inclination state detecting step. Thus, the side surfaces of the half cut grooves 21 can be prevented from being irradiated with the laser beam, and therefore the side surfaces of the manufactured device chip packages can be prevented from having a part not sealed with the resin.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A device chip package manufacturing method comprising:
   a cutting step of forming cut grooves having a depth reaching a finished thickness of device chips by cutting a device wafer from a top surface of the device wafer along a plurality of intersecting streets formed on the top surface by a cutting blade, the device wafer having devices formed in respective regions demarcated by the streets;
   a cut groove inclination state detecting step of detecting an inclination state of the cut grooves that is performed after the cutting step is performed;
   a sealing resin layer forming step of forming a sealing resin layer coating the top surface and the cut grooves of the device wafer by supplying a sealing resin to the top surface of the device wafer after the cutting step and the cut groove inclination state detecting step are performed;
   a grinding step of thinning the device wafer to the finished thickness of the device chips by grinding an undersurface of the device wafer after the sealing resin layer forming step is performed; and
   a laser processing step of dividing the device wafer into individual chips and forming device chip packages by holding the device wafer by a holding surface of a chuck table and applying a laser beam having a wavelength absorbable by the sealing resin layer along the cut grooves of the device wafer held by the chuck table after the grinding step is performed;
   the laser processing step applying the laser beam in parallel with the cut grooves while the holding surface of the chuck table and the laser beam are inclined relative to each other on the basis of the inclination state of the cut grooves, the inclination state being detected in the cut groove inclination state detecting step.

2. The device chip package manufacturing method according to claim 1, wherein:
   the laser processing step applies the laser beam in parallel with the cut grooves by inclining the chuck table.

3. The device chip package manufacturing method according to claim 2, wherein the cut groove inclination state detecting step is performed by irradiating a laser beam from a laser displacement gage upon the device wafer.

4. The device chip package manufacturing method according to claim 2, wherein the cut groove inclination state detecting step is performed by using a depth of focus of an imaging unit including a microscope and an imaging element.

5. The device chip package manufacturing method according to claim 2, wherein the inclination state detected in the cut groove inclination state detecting step is stored in a non-transitory memory of a laser displacement gage.

6. The device chip package manufacturing method according to claim 1, wherein the cut groove inclination state detecting step is performed by irradiating a laser beam from a laser displacement gage upon the device wafer.

7. The device chip package manufacturing method according to claim 1, wherein the cut groove inclination state detecting step is performed by using a depth of focus of an imaging unit including a microscope and an imaging element.

8. The device chip package manufacturing method according to claim 1, wherein the inclination state detected in the cut groove inclination state detecting step is stored in a non-transitory memory of a laser displacement gage.

9. The device chip package manufacturing method according to claim 1, wherein the inclination state of the cut groove is due to the cutting blade being used during the cutting step being bent.

10. A device chip package manufacturing method comprising:
    a cutting step of forming cut grooves having a depth reaching a finished thickness of device chips by cutting a device wafer from a top surface of the device wafer along a plurality of intersecting streets formed on the top surface by a cutting blade, the device wafer having devices formed in respective regions demarcated by the streets;
    a cut groove inclination state detecting step of detecting an inclination state of the cut grooves while the cutting step is performed;
    a sealing resin layer forming step of forming a sealing resin layer coating the top surface and the cut grooves of the device wafer by supplying a sealing resin to the top surface of the device wafer after the cutting step and the cut groove inclination state detecting step are performed;
    a grinding step of thinning the device wafer to the finished thickness of the device chips by grinding an undersurface of the device wafer after the sealing resin layer forming step is performed; and
    a laser processing step of dividing the device wafer into individual chips and forming device chip packages by holding the device wafer by a holding surface of a chuck table and applying a laser beam having a wavelength absorbable by the sealing resin layer along the cut grooves of the device wafer held by the chuck table after the grinding step is performed;
    the laser processing step applying the laser beam in parallel with the cut grooves while the holding surface of the chuck table and the laser beam are inclined relative to each other on the basis of the inclination state of the cut grooves, the inclination state being detected in the cut groove inclination state detecting step.

11. The device chip package manufacturing method according to claim 10, wherein:

the laser processing step applies the laser beam in parallel with the cut grooves by inclining the chuck table.

12. The device chip package manufacturing method according to claim 10, wherein the inclination state of the cut groove is due to the cutting blade being used during the cutting step being bent.

\* \* \* \* \*